US007110897B2

(12) United States Patent
Nadig et al.

(10) Patent No.: US 7,110,897 B2
(45) Date of Patent: Sep. 19, 2006

(54) IDENTIFICATION OF AVERAGE TOTAL LOSS AND SWITCHING LOSS IN DUTY CYCLE AND/OR FREQUENCY VARIATION SIGNALS ACQUIRED ACROSS A SWITCHING DEVICE USING A DSO

(75) Inventors: Srikrishna H. Nadig, Bangalore (IN); Godfree Coelho, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/945,763

(22) Filed: Sep. 20, 2004

(65) Prior Publication Data
US 2005/0062461 A1    Mar. 24, 2005

Related U.S. Application Data

(60) Provisional application No. 60/504,908, filed on Sep. 22, 2003.

(51) Int. Cl.
*G06F 19/00* (2006.01)
(52) U.S. Cl. .......................................... 702/66; 324/222
(58) Field of Classification Search .................. 702/66, 702/189, 64; 324/222, 223, 641, 659, 76.11
See application file for complete search history.

(56) References Cited

U.S. PATENT DOCUMENTS 5,875,103 A    2/1999    Bhagwat

| 6,208,185 | B1 | 3/2001 | John et al. |
| 6,278,357 | B1* | 8/2001 | Croushore et al. ...... 340/310.01 |
| 6,388,896 | B1 | 5/2002 | Cuk |
| 6,400,579 | B1* | 6/2002 | Cuk ............................ 363/16 |
| 6,400,581 | B1 | 6/2002 | Lee |
| 6,414,854 | B1 | 7/2002 | Itoh et al. |
| 2002/0001204 | A1 | 1/2002 | Lentini et al. |
| 2002/0153868 | A1* | 10/2002 | Takita ......................... 323/282 |
| 2003/0102845 | A1 | 6/2003 | Aker et al. |
| 2003/0128555 | A1 | 7/2003 | Schemmann et al. |
| 2003/0179595 | A1 | 9/2003 | Kleveland |
| 2003/0214770 | A1 | 11/2003 | Schimanek et al. |

FOREIGN PATENT DOCUMENTS

| WO | WO 01/86792 A1 | 11/2001 |
| WO | WO 02/41478 A2 | 5/2002 |
| WO | WO 03/001655 A2 | 1/2003 |

* cited by examiner

*Primary Examiner*—Edward Raymond
(74) *Attorney, Agent, or Firm*—Thomas F. Lenihan

(57) ABSTRACT

The subject apparatus and method measures the Total Average Power Loss and isolates the different power loss components of Total Average Loss such as $T_{on}$ Loss and $T_{off}$ loss at switching devices such as, MOSFETs, BJTs and IGBTs that may be used in a switching power supply. It provides separation of the components of Total Average Loss as Turn Ton Loss, Turn Toff Loss and allows derivation of conduction loss. It also has the capability to measure Total Average Loss and Switching Loss, while amplitude, duty cycle and frequency of the switching signal is varying in a switching power supply.

22 Claims, 6 Drawing Sheets

IDENTIFICATION OF AVERAGE TOTAL LOSS AND SWITCHING LOSS IN DUTY CYCLE AND/OR FREQUENCY VARIATION SIGNALS ACQUIRED ACROSS A SWITCHING DEVICE USING A DSO

CLAIM OF PRIORITY

The subject application claims priority from U.S. Provisional Patent Application No. 60/504,908 entitled, IDENTIFICATION OF AVERAGE TOTAL LOSS AND SWITCHING LOSS IN DUTY CYCLE AND/OR FREQUENCY VARIATION SIGNALS ACQUIRED ACROSS A SWITCHING DEVICE USING 8-BIT DSO (Srikrishna, et al.), filed 22 Sep. 2003.

FIELD OF THE INVENTION

The subject invention generally concerns measurement of signals related to switching devices and specifically concerns in-circuit measurements of signals acquired across a switching device by use of a Digital Storage Oscilloscope (DSO).

BACKGROUND OF THE INVENTION

Total average power loss is the significant component in the overall power loss of a switching power supply and is estimated at 35% to 40%. The Total average power loss has an adverse impact on the performance of the switching power supply, by reducing efficiency and reliability, and by causing an increase in the size of the needed heat sink.

In order to know the exact impact, it is important to measure and characterize the total average power loss, switching loss at the switching device. Unfortunately, there are no currently available test tools in market to measure total average power loss or to measure switching loss in time varying signals.

Total average and switching loss at a switching device is currently analyzed by two methods: Thermal, and Manual. The Thermal technique has following limitations and difficulties. The design engineer needs stimuli to excite the switching device with proper voltage and current. It is time consuming, prone to human error, and the design engineer cannot isolate power loss components such as Ton loss, Toff loss, and conduction loss.

The second method uses a Digital Storage Oscilloscope (DSO) and a Manual measurement technique. This measurement technique has following limitations and difficulties. It, too, is time consuming. It, too cannot separately measure Ton time loss or Toff time loss. Moreover, it is not possible to make measurements when the duty cycle and frequency of switching cycle are varying.

Because of this complexity in measurement, most of the time, designers over-design the Switch Mode Power Supply (SMPS) resulting in lower efficiency and higher cost.

What is needed is an automated method of measuring Total average power loss, and switching loss using a digital storage oscilloscope. This technique of measurement can be applied to switching power supplies that are used in the Computer, Communication, Automotive, and Electronic Ballast industries, thereby overcoming the above-described limitations of thermal and manual computation.

SUMMARY OF THE INVENTION

The subject apparatus and method measures the Total Average Power Loss and isolates the different power loss components of Total Average Loss such as $T_{on}$ Loss and $T_{off}$ loss at switching devices such as, MOSFETs, BJTs and IGBTs that may be used in a switching power supply.

A first aspect of the invention allows automatic measurement of switching loss. A second aspect of the invention provides separation of the components of Total Average Loss as Turn Ton Loss, Turn Toff Loss and allows derivation of conduction loss.

A third aspect of the invention Improves measurement accuracy by applying signal conditioning, thereby eliminating the impact of noise during the off state of the switching device.

A fourth aspect of the invention provides support for testing of P channel and N channel devices.

A fifth aspect of the invention is the avoidance of false detection of switching transitions due to ringing.

A sixth aspect of the invention is the ability to measure Total Average Loss using a digital storage oscilloscope.

A seventh aspect of the invention is the capability to measure Total Average Loss and Switching Loss, while amplitude, duty cycle and frequency of the switching signal is varying in a switching power supply.

An eighth aspect of the invention is the adaptability of the measurement technique, which enables the designer to measure Total average loss and switching loss for different types of topologies deployed in AC-DC and DC—DC converters-
.verage Power Loss and isolates the different power loss components of Total Average Loss such as $T_{on}$ Loss and $T_{off}$ loss at switching devices such as, MOSFETs, BJTs and IGBTs that may be used in a switching power supply.

A first aspect of the invention allows automatic measurement of switching loss. A second aspect of the invention provides separation of the components of Total Average Loss as Turn Ton Loss, Turn Toff Loss and allows derivation of conduction loss.

A third aspect of the invention Improves measurement accuracy by applying signal conditioning, thereby eliminating the impact of noise during the off state of the switching device.

A fourth aspect of the invention provides support for testing of P channel and N channel devices.

A fifth aspect of the invention is the avoidance of false detection of switching transitions due to ringing.

A sixth aspect of the invention is the ability to measure Total Average Loss using a digital storage oscilloscope.

A seventh aspect of the invention is the capability to measure Total Average Loss and Switching Loss, while amplitude, duty cycle and frequency of the switching signal is varying in a switching power supply.

An eighth aspect of the invention is the adaptability of the measurement technique, which enables the designer to measure Total average loss and switching loss for different types of topologies deployed in AC-DC and DC—DC converters.

DETAILED DESCRIPTION OF THE EMBODIMENTS

As noted above, the subject apparatus and method is used to measure Total Average Power Loss and then isolating the different power loss component in total average loss such as $T_{on}$ Loss and $T_{off}$ loss at switching device such as MOSFET, BJT and IGBT in a switching power supply. This helps a switching power supply designer to pinpoint inefficiency of the switching power supply. $T_{on}$ loss+$T_{off}$ loss also known as switching loss.

Also the measurement technique is adaptable, to enable the designer to measure Total Average Loss and Switching Loss for different types of topologies deployed in AC-DC and DC—DC converters, which are used in Computer, Communication, Lighting, and Automotive applications. The type of converter used depends upon the power supply requirements of each particular application. As noted above, the subject invention measures switching loss using a digital storage oscilloscope.

Figure 1:
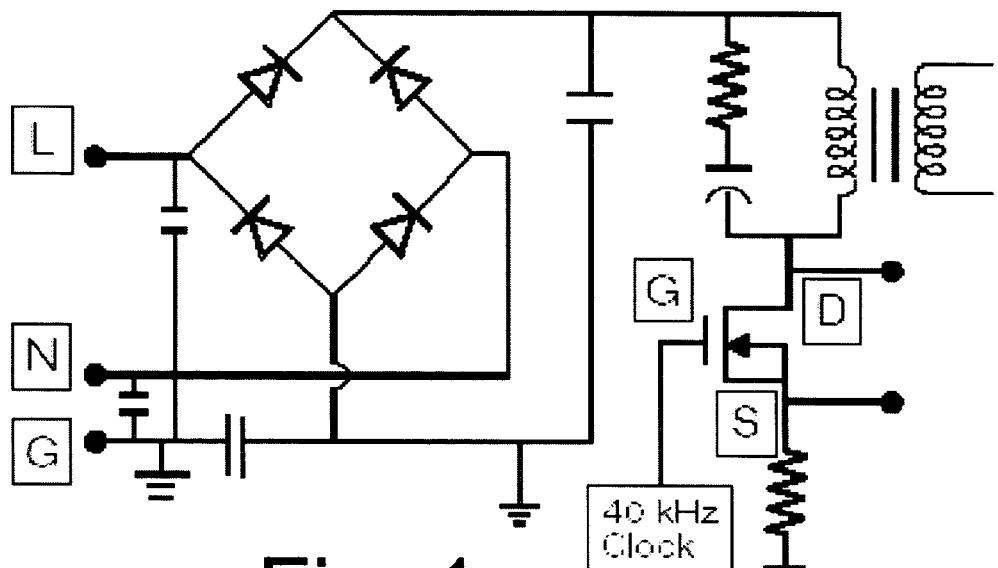
FIG. 1 shows a simplified schematic of a typical switching power supply, as known from the prior art.

FIG. 1 shows a simplified schematic of a typical switching power supply, as known from the prior art. The voltage and current waveform across the switching device is acquired using an oscilloscope connected to test points D and S, as shown in FIG. 1.

Voltage Vds is measured across the switching device (FET), and current Ids is measured through the switching device. The gate drive signal is Vgs. Advanced switching loss analysis is employed for calculating the power loss (energy across the switching device). The calculated loss is for all the complete switching cycles in the acquired record. Advanced switching loss measurement needs following signals, Switching Voltage and Switching Current. Based on the topology and load condition of the converter analysis sometimes also needs the gate drive signal Vgs. In the switching loss analysis using switch voltage and current, the switching transitions are detected using the switch voltage.

Figure 2:
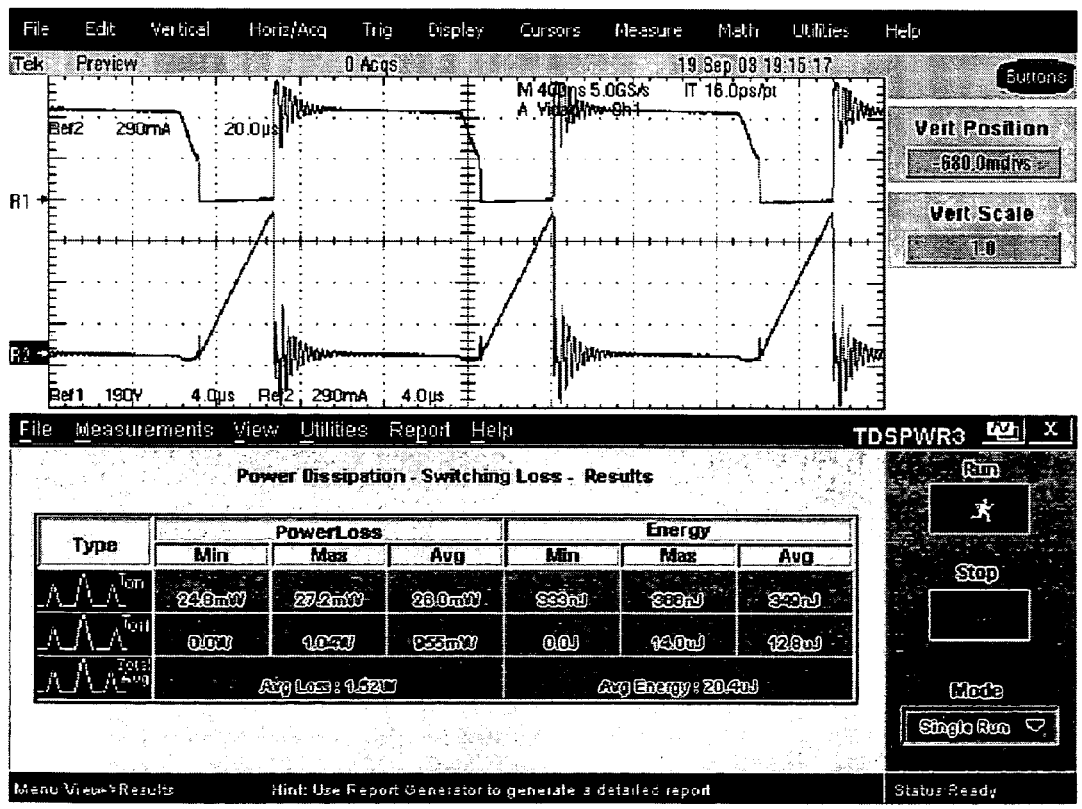
FIGS. 2, 3, 5, 7, 8, and 11 are oscilloscope screenshots useful in understanding the invention.

As shown in FIG. 2, ON and OFF loss and energy are calculated for the switching event, and statistical results of maximum, minimum, and average for each acquisition are displayed. FIG. 2 shows typical flyback topology waveforms. Ref1 is the switch voltage captured across the switching device (MOSFET drain to source) and Ref2 is the switching current (Idrain).

Figure 3:
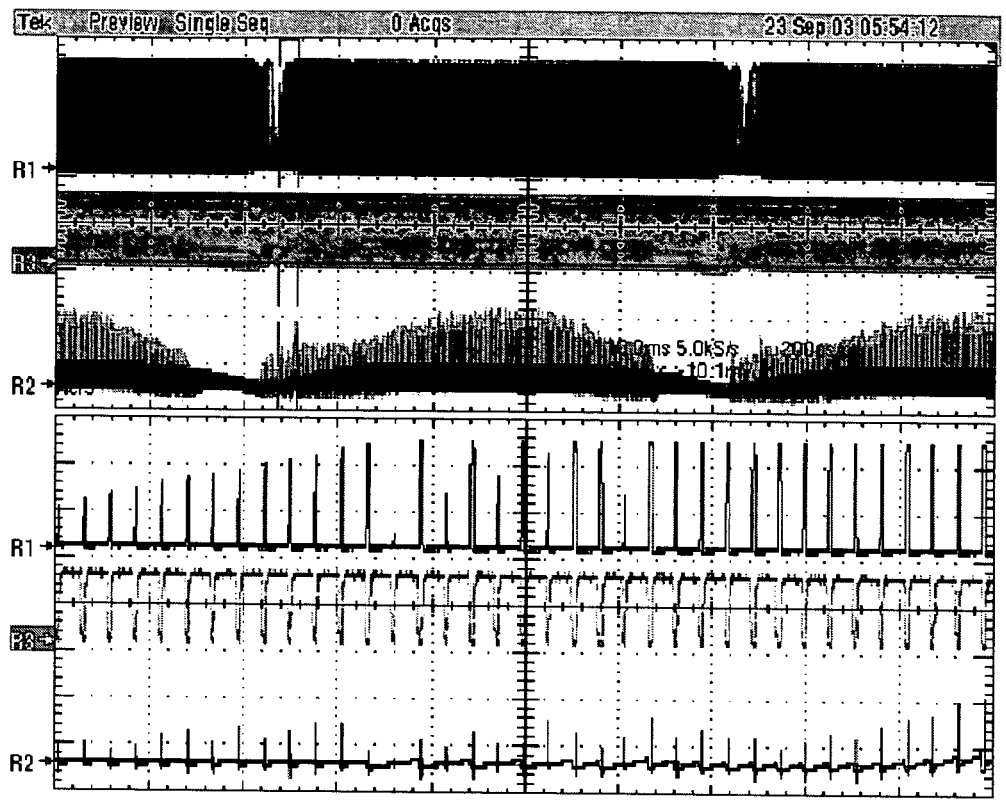

A signal captured from the Active Power Factor Correction (APFC) portion is zoomed and shown in FIG. 3. During this portion current is very low as shown and the switching voltage is in Discontinuous Conduction Mode (DCM mode). It is not possible to identify the switching cycles using only switching voltage and current. So, the gate drive signal is used to identify the switching cycles. The gate drive signal Vgs is clean and does not vary in magnitude.

The novel approach of the subject invention eliminates the complexity involved in measuring the switching loss under the variation of the switch voltage, switch current, and duty cycle as shown in and FIG. 3. Referring to the screenshot of FIG. 3, R1 is the switch voltage signal, R2 is the switch current and R3 is the gate drive signal. The lower half of the screenshot is the zoomed in portion of the all three waveforms.

Figure 4:
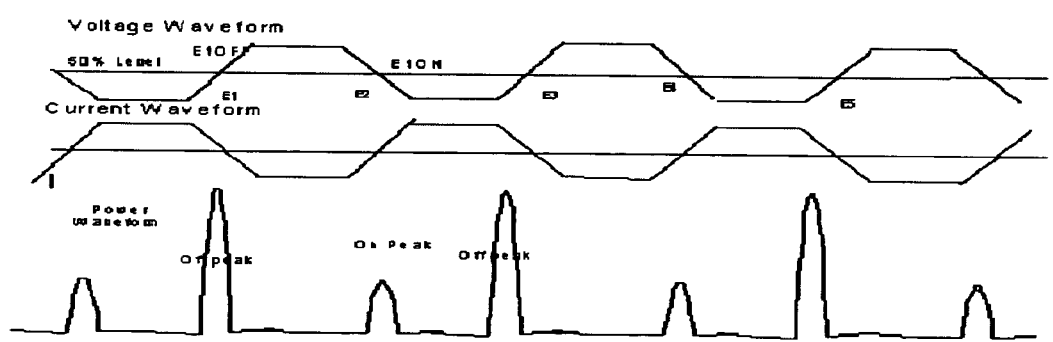
FIGS. 4, 6, and 9 are waveform diagrams useful in understanding the invention.

An ideal power waveform is shown in FIG. 4. Referring to FIG. 4, E1 and E2 are the switching-off and switching-on portions. The portion of the waveforms between E1 and E2 is off condition, and the portion of the waveforms between E2 and E3 is the conduction portion The Switching-ON energy is the integration of the power signal (i.e., the product of switching voltage and current) from the start (approximately 5% of the max of the switching cycle) of the switch current, to stop (approximately 5% of the max of the switching cycle) of switch voltage during the E2. The Switching-OFF energy is the integration of the power signal (i.e., the product of switch voltage and current) from start (approximately 5% of the max of the switching cycle) of switch voltage to stop (approximately 5% of the max of the switching cycle) of switch current E1. The maximum is calculated locally for each switching cycle on switch voltage and current.

The real challenge is to identify the start of the data index for the waveform portion of Switching-On E2 and Switching-Off E1 for practical situations. During the Switching-ON and Off portions, the voltage and current waveforms experience spikes and these spikes prevent the identification of the correct start and stop index.

For the following discussion, assume that $V_{ds}(t)$ is the acquired voltage waveform, $I_{ds}(t)$ is current waveform, and $V_{gs}(t)$ is the gate to source voltage waveform.

Figure 5:
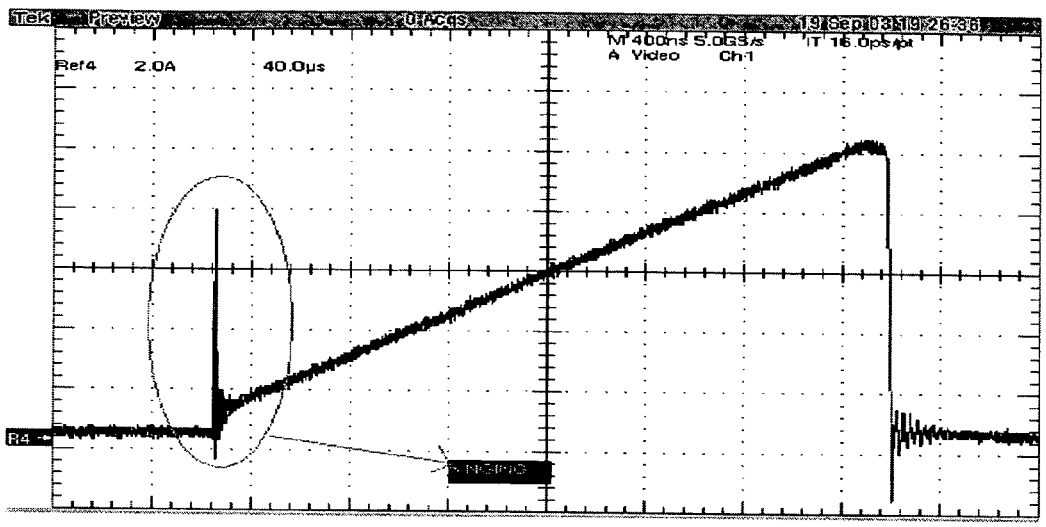

During switch ON, the switch current increases and can have a sudden spike or close ringing (See circled portion of FIG. 5). These ringing causes wrong identification of start of TON as in FIG. 5. Switching current theoretically is zero from the turn-off to next turn-on. There is a small positive current in this portion (which is system (probe+oscilloscope) floor noise). Multiplying this portion of the switch current by the corresponding switching voltage (which is at 100's of volts) will result in significant power loss, and may even exceed the actual switching loss. The loss contributed by this portion is reduced to zero by causing switch current to be zero from the end of the turn-OFF state to start of the turn-ON state. The power loss calculated using the signal conditioned switch current has accurate results. The switch current phase lags or leads with respect to the switch voltage during switch-ON and switch-OFF transitions. Edges are identified for both slopes (Rising and Falling) on the voltage waveform at 50% level using the waveform analysis module. The edge timing values and indices are stored in a buffer with time (for explanation) and with an attribute of ON-edge and Off-edge.

The following steps are used to find start of TON: The device (FET of FIG. 1) starts to conduct the moment it reaches the 5% of the maximum current in that cycle. This index on the current waveform is the start of the switch ON.

While identifying the start index on the current waveform, the current waveform is passed through the software moving average filter to avoid ringing. The filtered current waveform is used for identifying the start index. The index of the filtered current waveform is mapped to the actual current for the calculation of Ton Loss.

The window determines the portion of the data being considered for the moving average. Let E1, E2, and E3 timing value on the time buffer of the Previous Off, next On, and Next Off.

$$\text{Twinstart}=(E2-E1)/2$$

$$\text{Twinend}=(E3-E2)/2$$

Figure 6:
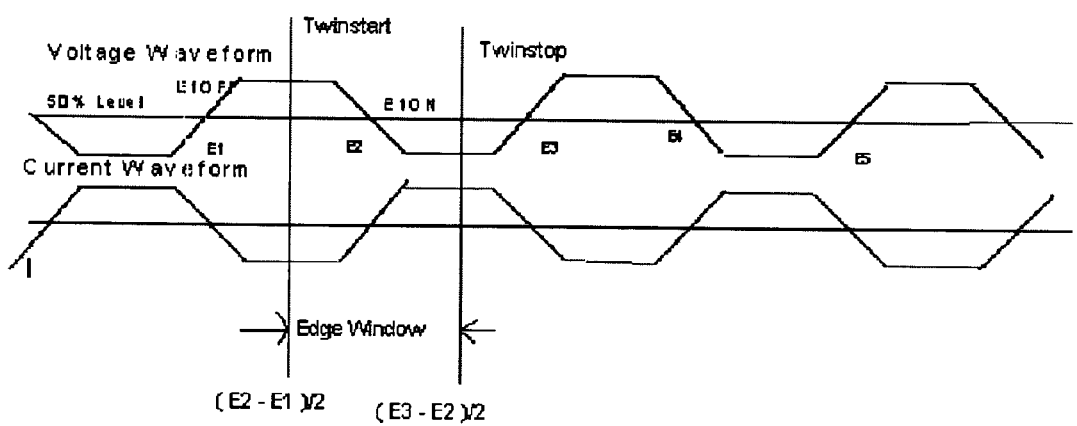

FIG. 6 is used in the Calculation of edge window $$I_{m\ ovg}(t) = 1/M \sum_{k=0}^{M-1} Ids\ (n-k)$$

Where M in the above equation is four sample points.

Locate the 5%(default level) of max current on the $I_{movg(t)}$ data. Let this index be $T_{startonl}$.

In this example assume that the ringing level must be at least 5% of the maximum (current). Also assume that if there is a DC offset on the current waveform, then current will not reach a zero level. So, the user has to compensate the DC offset before running the measurement.

The following is used to find stop of TON. Apply the window described above with respect to FIG. 6. Move forward (i.e., left to right) from the start of the window (Twinstart to Twinstop) to 5% percent of the max (switch voltage).

The following is used to find start of TOFF. Apply the window described above with respect to FIG. 6. Move backward (i.e., right to left) from the stop of the window (Twinstop to next Twinstart) to 5% percent of the max (switch voltage).

The following is used to find stop of TOFF. Apply the window described above FIG. 6. Move forward (i.e., right to left) from the start of the window ((Twinstart to next Twinstop)) to 5% percent of the max (switch current).

Figure 7:
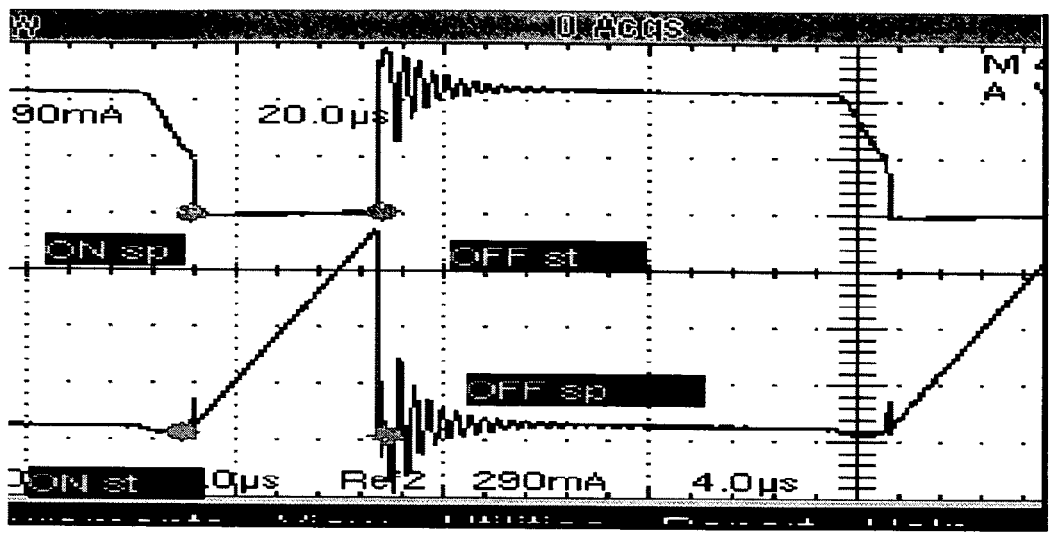
Figure 8:
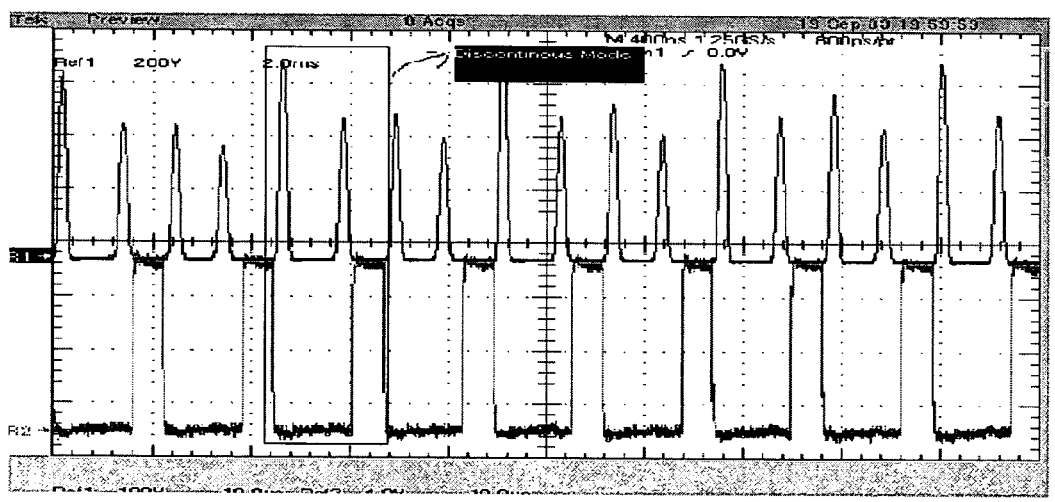

The identified indexes, Ton start, Ton stop, Toff start, Toff stop, are represented on FIG. 7 as On st, On sp, Off st, and Off sp. That is, FIG. 7 shows the Start and Stop positions of switch current and voltage The following is a discussion of finding Switching Loss using switch voltage, current, and gate voltage. The switch voltage can vary in duty cycle and operating frequency as shown in the FIG. 8. As described earlier, switch voltage can operate in both Continuous Conduction Mode (CCM) and Discontinuous Conduction Mode (DCM). However, switching cycles cannot be identified using the switch voltage in this scenario. So the gate drive signal is used to identify the correct switching cycles and sections. FIG. 8 is a screenshot of waveforms illustrating Duty Cycle and Frequency variation. Ref1 is the switch voltage captured across the switching device. Ref2 is the gate drive signal. Ref1 goes into discontinuous conduction mode within the highlighted (i.e., "boxed") switching cycle.

In the above topology, the switching transition is identified on the gate voltage waveform. The gate voltage is inverse of the switching voltage. This means that a rising gate voltage waveform represents a condition in which the switch (i.e. FET of FIG. 1) is on and a falling gate voltage waveform represents a condition in which the switch as off.

The following is used to find the start of TON. The start of the TON is 5% level of the maximum gate voltage or 1.5V whichever level is encountered earlier during the rise transition of the gate voltage.

The following is used to find the stop of TON. Move forward (i.e., left to right on the waveform) and search for the level 5% on the switch voltage level on the switch voltage waveform during the ON transition Note: In case of synchronous MOSFETs, the gate drive signal starts from 1.5V and goes up to 3V or 4V. So, a software application in accordance with the subject invention preferably provides user-settable configuration options for the gate voltage.

The following is used to find the start of TOFF. TOFF is identified by using the gate voltage and the switch voltage waveforms. The switching device will be in conduction as long as the gate voltage is in a high state and the switch voltage is in a low state (conduction voltage). While the gate voltage falls, the index on the gate waveform at 80% is identified and applied to the switch voltage. With the switch voltage still in low state, we move forward to find the actual start of "switch off" using the switch voltage by finding the 5% level on the switch voltage.

The following is used to find the stop of TOFF. The 80% point of the gate voltage is the start index. From this start index on the switch current (falling slope) move forward (left to right on the waveform) until 5% of the maximum of switch current is met.

Figure 9:
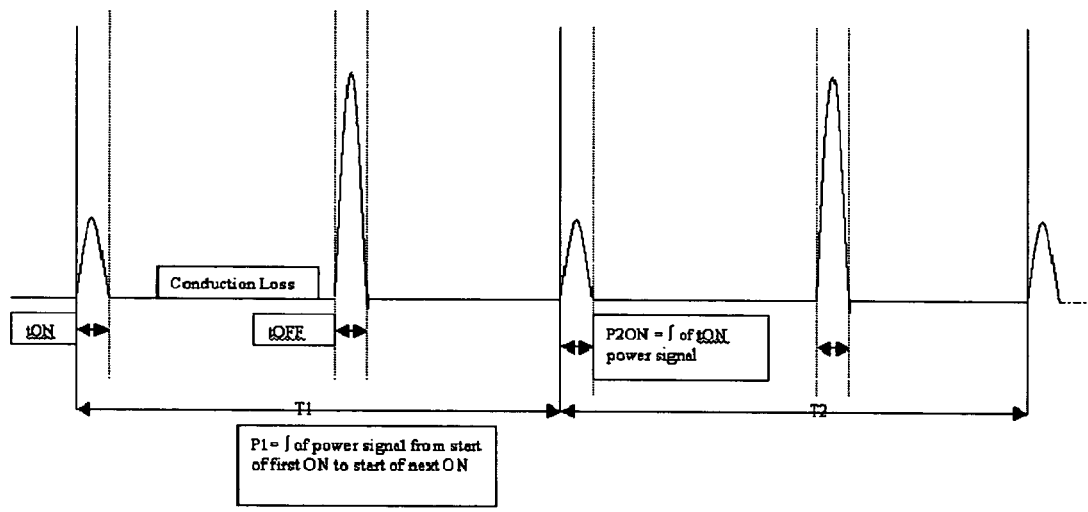

Loss calculation for the TON, TOFF, and Average Total Loss is as follows. After getting the indexes for each of $T_{onstart}$, $T_{onstop}$, $T_{offstart}$, $T_{offstop}$, the voltage and current data between the indexes are taken for the calculation of the On time loss, Off time loss, On energy, and Off energy, on the power waveform of FIG. 9. Where T1 is the first switching cycle, T2 is second switching cycle, and:

Total Loss=$1/(T1+T2 \ldots Tn)^* \int P(t)dt$

Where $\int P(t)dt = \Sigma \int P1(t) + \int P2(2) \ldots \int Pn(t)$

TON Loss=$1/(T1+T2 \ldots Tn)^* \int PON(t)dt$

Where $\int PON(t)dt = \Sigma \int PON1(t) + \int PON2(2) \ldots \int PONn(t)$

TOFF Loss=$1/(T1+T2 \ldots Tn)^* \int POFF(t)\ dt$

Where $\int POFF(t)dt = \Sigma \int PON1(t) + \int POFF2(2) \ldots \int POFFn(t)$ The following is used to find Total Average Loss. Total Average Loss is the summation of the On time Loss (Pon), Off time Loss (Poff), and the Conduction Loss. The Conduction loss is calculated based on the type of the switching device used. If the switching device is a MOSFET, then Rds ON is used. If the switching device is a transistor like an IGBT or a BJT, then Vsat is used. The Conduction loss is calculated using Rds ON or Vsat as the input. The user obtains the Rds On or Vsat from the data sheet of the switching device for the relevant operating temperature.

If Rds ON is used, the following equation is used to calculate conduction loss.

Conduction loss=$(I_{rms})^2 \cdot R_{dson}$ $I_{rms}$ is the rms value of the switching current ($I_{ds}$).

If Vsat is used, the following equation is used to calculate conduction loss

Conduction loss=$(I_{rms} * V_{sat})$

Total loss=Pon loss+Poff loss+Conduction loss

Total energy=TON energy+TOFF energy+Conduction energy

Figure 10:
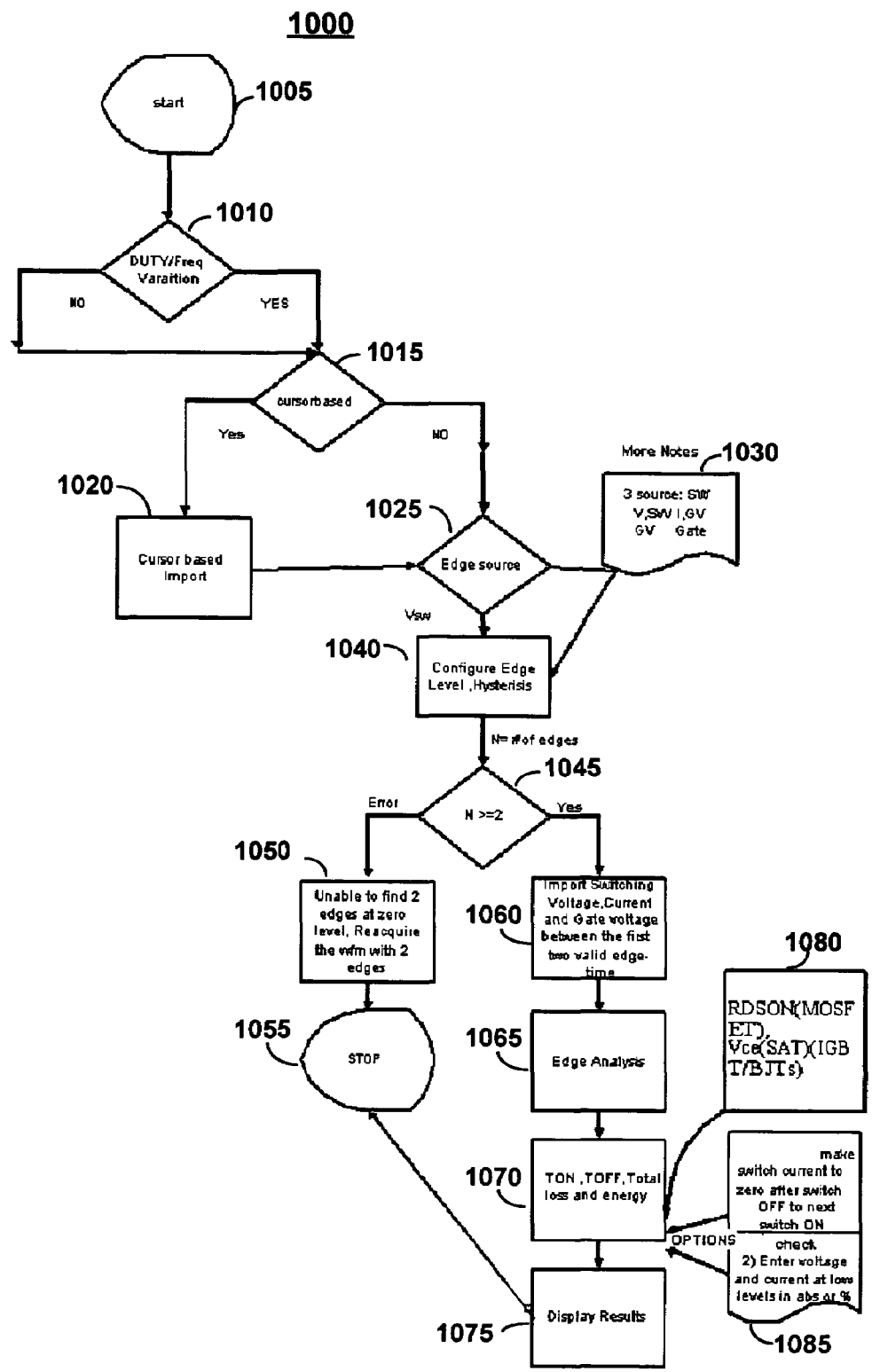
FIG. 10 is a flowchart showing an embodiment of the inventive method.

FIG. 10 is a flowchart of an Advanced Switching Loss algorithm 1000 of the subject invention that accommodates different topologies and Power Factor Corrections (PFCs). Algorithm 1000 is entered at step 1005 and moves to decision step 1010 wherein a check is made to see if there are Duty Cycle or Frequency variations. This is actually a User Interface (UI) configuration issue, so in either case, the subject algorithm advances to decision step 1015. If, at step 1015, the calculation is to be cursor-based, then the YES path is taken to step 1020 wherein the necessary cursor-based data is imported, and the routine advances to step 1025. If, at step 1015, it was determined that the calculation was not to be cursor-based then, the NO path is taken directly to step 1025. At step 1025, the algorithm obtains information (according to note 1030, for example) concerning the edge source, and then advances to step 1045 to see if the number of acquired edges is greater than or equal to 2. If not, the routine advances along the NO path to step 1050 where the oscilloscope is directed to reacquire a waveform (wfm) with at least 2 edges, and stops further processing at step 1055. If at least 2 edges of the waveform had been acquired, then the YES path is taken from decision diamond 1045 to process block (i.e. step) 1060. At step 1060 Switching Voltage, Switching Current, and Gate Voltage data from between the first two valid edges are imported. At step 1065, an edge analysis is performed using this data. At step 1070, TON, TOFF, Total Loss, and Energy are computed using the procedures described above, using criteria such as illustrated in notes 1080 and 1085, depending upon the switching device topology used. At step 1075, the results are displayed and the algorithm ends at step 1055 (STOP).

Flexibility in switching loss measurement is provided by the subject invention as follows. One skilled in the art can use cursor-based measurements to measure the switching loss on the signal, which is periodic. The switching loss is calculated on the integral number of cycles. Use of the cursor enables a user to easily select a desired portion of the data on which to calculate the loss.

Active power factor correction and electronic ballast switching signals are modulated with line frequency. So, the cursor is used to select the waveform data to measure the loss for one complete line cycle.

For the Switching Loss Algorithm, assume that
1) The switching energy or loss measurement does not change irrespective of the topology used, either in current or voltage mode of operation.
2) When a transistor is turned ON, the output switching voltage will have a falling slope and a rising output-switching current. The overlap of this voltage and current will dissipate the peak power.
3) When a transistor is turned OFF, the output switching voltage will have a rising slope and the output-switching current will have a falling slope. The overlap of this voltage and current will dissipate the peak power.
4) The Rise Time and Fall Time measurements have a minimum of three samples between 10%–90%.

Figure 11:
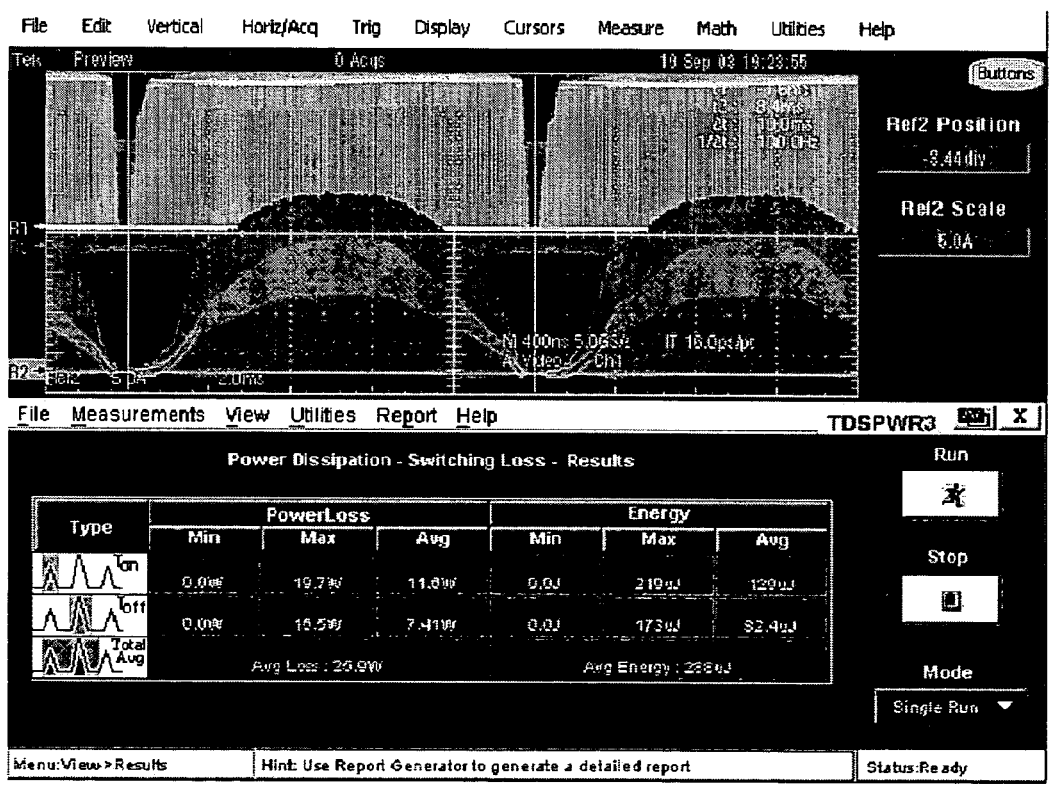

The teaching of the subject application may be embodied in a software application for an oscilloscope. Modern oscilloscopes include a microprocessor capable of running, for example, a Windows® operating system and one skilled in the art will recognize that this software application is suitable for such an environment. In this regard, FIG. 2 shows a screenshot of such a software application in accordance with the Advanced Switching Loss teaching of the subject invention, displaying switching voltage and current. FIG. 11 shows a screenshot of such a software application in accordance with the Advanced Switching Loss teaching of the subject invention, displaying switching voltage, current, and gate drive signal.

The scope of the subject invention is to be determined on the basis of the following claims.

What is claimed is:

1. A method for measuring Total Average Loss and Switch Loss, comprising the steps of: acquiring waveform data; identifying a portion of a waveform for measurement from said waveform data; calculating On-time Loss for said portion; calculating Off-time Loss for said portion; calculating Conduction Loss; summing results of calculations for On-time Loss, Off-time Loss, and Conduction Loss; and said displaying said results of said calculations on a display screen of an oscilloscope.

2. The method of claim 1 wherein in said step of identifying said portion of said waveform, said portion comprises at least two of said cycles.

3. The method of claim 1 wherein in said step of identifying said portion of said waveform, said portion comprises the data between two user-positionable cursors.

4. The method of claim 1 wherein the step of acquiring waveform data includes the step of acquiring switching voltage data and current data.

5. The method of claim 4 wherein the step of acquiring current data includes a step of filtering said current data to form a filtered current waveform.

6. The method of claim 5 wherein said filtering is performed by a software moving average filter.

7. The method of claim 1 wherein the step of acquiring waveform data includes the step of acquiring gate signal data.

8. The method of claim 1 wherein the step of calculating Conduction Loss is dependent upon a kind of switching device used.

9. The method of claim 8 wherein when a MOSFET is used as said switching device then RDs On is used to calculate Conduction Loss.

10. The method of claim 8 wherein when said switching device is one of an IGBT or a BJT transistor, then Vsat is used to calculate Conduction Loss.

11. The method of claim 1 wherein Total Average Loss is measured during a time in which any of amplitude, duty cycle, and frequency, of the switching signal are varying in a switching power supply.

12. The method of claim 1 wherein Switching Loss is measured during a time in which any of amplitude, duty cycle, and frequency, of the switching signal are varying in a switching power supply.

13. An oscilloscope for measuring Total Average Loss and Switching Loss for different types of switching device topologies employed in AC-DC and DC—DC converters, said oscilloscope comprising:
at least one voltage probe for acquiring voltage waveform data;
a current probe for acquiring current waveform data; and
a display screen for displaying results of calculations;
said oscilloscope identifying a measurement portion of said waveform from said waveform data;
said oscilloscope calculating On-time Loss for said measurement portion;
said oscilloscope calculating Off-time Loss for said measurement portion;
said oscilloscope calculating Conduction Loss; and
said oscilloscope summing results of calculations for On-time Loss, Off-time Loss, and Conduction Loss; and
said oscilloscope displaying said results of said calculations on said display screen.

14. The oscilloscope of claim 13 wherein in said measurement portion of said waveform comprises at least two of cycles.

15. The oscilloscope of claim 13 wherein in said measurement portion of said waveform comprises the data between two user-positionable cursors.

16. The oscilloscope of claim 13 wherein said acquired current data is filtered to form a filtered current waveform.

17. The oscilloscope of claim 16 wherein said filtered current waveform is produced by a software moving average filter in response to said acquired current data.

18. The oscilloscope of claim 13 wherein a kind of switching device used affects the calculation of Conduction Loss.

19. The oscilloscope of claim 18 wherein when a MOSFET is used as said switching device then RDs On is used to calculate Conduction Loss.

20. The oscilloscope of claim 18 wherein when said switching device is one of an IGBT or a BJT transistor, then Vsat is used to calculate Conduction Loss.

21. The oscilloscope of claim 13 wherein Total Average Loss is measured during a time in which any of amplitude, duty cycle, and frequency, of the switching signal are varying in a switching power supply.

22. The oscilloscope of claim 13 wherein Switching Loss is measured during a time in which any of amplitude, duty cycle, and frequency, of the switching signal are varying in a switching power supply.

* * * * *